(12) United States Patent
De Waele et al.

(10) Patent No.: US 11,669,063 B2
(45) Date of Patent: Jun. 6, 2023

(54) SURROGATE MODEL FOR A CHEMICAL PRODUCTION PROCESS

(71) Applicant: ExxonMobil Technology and Engineering Company, Annandale, NJ (US)

(72) Inventors: Stijn De Waele, Flemington, NJ (US); Myun-Seok Cheon, Whitehouse Station, NJ (US); Kuang-Hung Liu, Basking Ridge, NJ (US); Shivakumar Kameswaran, Katy, TX (US); Francisco Trespalacios, Spring, TX (US); Dimitri J. Papageorgiou, Stewartsville, NJ (US)

(73) Assignee: ExxonMobil Technology and Engineering Company, Annandale, NJ (US)

(*) Notice: Subject to any disclaimer, the term of this patent is extended or adjusted under 35 U.S.C. 154(b) by 657 days.

(21) Appl. No.: 16/662,460

(22) Filed: Oct. 24, 2019

(65) Prior Publication Data
US 2020/0167647 A1 May 28, 2020

Related U.S. Application Data

(60) Provisional application No. 62/772,268, filed on Nov. 28, 2018.

(51) Int. Cl.
*G05B 17/02* (2006.01)
*G06F 30/20* (2020.01)
(Continued)

(52) U.S. Cl.
CPC ............. *G05B 17/02* (2013.01); *G06F 17/18* (2013.01); *G06F 18/214* (2023.01); *G06F 30/20* (2020.01); *G06N 3/08* (2013.01)

(58) Field of Classification Search
USPC .......................................................... 706/25
See application file for complete search history.

(56) References Cited

U.S. PATENT DOCUMENTS 6,611,735 B1 * 8/2003 Henly .................... G06Q 10/04
  702/30
7,454,321 B1 * 11/2008 Rai ......................... G06N 3/045
  703/2

(Continued)

OTHER PUBLICATIONS

Tobias Peter (Using Deep Learning as a surrogate model in Multi-objective Evolutionary Algorithms, Institute for Intelligent Cooperative Systems, 2018, pp. 1-97) (Year: 2018).*

(Continued)

*Primary Examiner* — Iftekhar A Khan
(74) *Attorney, Agent, or Firm* — Vorys, Sater, Seymour and Pease LLP

(57) ABSTRACT

Aspects of the technology described herein comprise a surrogate model for a chemical production process. A surrogate model is a machine learned model that uses a collection of inputs and outputs from a simulation of the chemical production process and/or actual production data as training data. Once trained, the surrogate model can estimate an output of a chemical production process given an input to the process. Surrogate models are not directly constrained by physical conditions in a plant. This can cause them to suggest optimized outputs that the not possible to produce in the real world. It is a significant challenge to train a surrogate model to only produce outputs that are possible. The technology described herein improves upon previous surrogate models by constraining the output of the surrogate model to outputs that are possible in the real world.

17 Claims, 8 Drawing Sheets

(51) Int. Cl.
  *G06F 17/18* (2006.01)
  *G06N 3/08* (2023.01)
  *G06F 18/214* (2023.01)

(56) References Cited

U.S. PATENT DOCUMENTS

| | | | | |
|---|---|---|---|---|
| 7,543,743 | B1* | 6/2009 | Yu | G06Q 10/087 |
| | | | | 705/28 |
| 8,620,705 | B2* | 12/2013 | Peterson | G06Q 10/04 |
| | | | | 700/28 |
| 8,849,623 | B2* | 9/2014 | Carvallo | E21B 43/00 |
| | | | | 703/2 |
| 9,043,189 | B2* | 5/2015 | Wallace | G06G 7/57 |
| | | | | 703/5 |
| 9,085,957 | B2* | 7/2015 | Wallace | E21B 43/00 |
| 9,187,984 | B2* | 11/2015 | Usadi | E21B 43/00 |
| 9,805,402 | B1* | 10/2017 | Maurer | G06Q 10/087 |
| 9,864,354 | B2* | 1/2018 | Mifflin | G05B 17/02 |
| 10,087,721 | B2* | 10/2018 | Usadi | G06N 3/042 |
| 2003/0033040 | A1* | 2/2003 | Billings | G05B 13/021 |
| | | | | 700/109 |
| 2003/0097243 | A1* | 5/2003 | Mays | G05B 13/042 |
| | | | | 703/2 |
| 2004/0186765 | A1* | 9/2004 | Kataoka | G06Q 10/06 |
| | | | | 705/7.29 |
| 2005/0119768 | A1* | 6/2005 | Retsina | G05B 13/042 |
| | | | | 700/47 |
| 2007/0050206 | A1* | 3/2007 | Whikehart | G06Q 10/10 |
| | | | | 705/28 |
| 2007/0168328 | A1* | 7/2007 | Peralta | G06N 3/02 |
| 2007/0255605 | A1* | 11/2007 | Meade | G06Q 10/06 |
| | | | | 700/108 |
| 2008/0102529 | A1* | 5/2008 | Butler | C10G 49/26 |
| | | | | 436/55 |
| 2011/0238392 | A1* | 9/2011 | Carvallo | E21B 43/00 |
| | | | | 703/2 |
| 2012/0158389 | A1 | 6/2012 | Wu et al. | |
| 2012/0317060 | A1* | 12/2012 | Jebara | G06N 20/00 |
| | | | | 706/21 |
| 2013/0096898 | A1* | 4/2013 | Usadi | G01V 99/005 |
| | | | | 703/10 |
| 2013/0204420 | A1* | 8/2013 | Treiber | G06Q 10/06395 |
| | | | | 700/103 |
| 2013/0215116 | A1* | 8/2013 | Siddique | G06Q 20/40 |
| | | | | 705/26.7 |
| 2013/0246032 | A1* | 9/2013 | El-Bakry | G06F 30/20 |
| | | | | 703/10 |
| 2014/0018949 | A1* | 1/2014 | Linton | G06N 5/02 |
| | | | | 700/99 |
| 2014/0210821 | A1* | 7/2014 | Kapoor | G06T 15/08 |
| | | | | 345/424 |
| 2014/0324521 | A1* | 10/2014 | Mun | G06Q 30/0201 |
| | | | | 705/7.28 |
| 2016/0210602 | A1* | 7/2016 | Siddique | G06T 17/00 |
| 2017/0097616 | A1* | 4/2017 | Cozad | G06F 3/0484 |
| 2017/0148111 | A1* | 5/2017 | Cheon | G06Q 10/06315 |
| 2017/0308831 | A1* | 10/2017 | Apap | G06F 17/18 |
| 2018/0087357 | A1* | 3/2018 | Conn | E21B 43/2406 |
| 2018/0258761 | A1* | 9/2018 | Babin | G06F 30/20 |
| 2018/0346151 | A1* | 12/2018 | Sturlaugson | G06N 20/20 |
| 2020/0097869 | A1* | 3/2020 | Bajaj | G06Q 10/087 |
| 2020/0167647 | A1* | 5/2020 | De Waele | G06F 30/20 |
| 2020/0184401 | A1* | 6/2020 | Papageorgiou | G06Q 10/087 |
| 2020/0357486 | A1* | 11/2020 | Kok | G06N 20/00 |

OTHER PUBLICATIONS

Pham et al. (Convex Hull Discretization Approach to the Global Optimization of Pooling Problems, Ind. Eng. Chem. Res. 2009, 48, 1973-1979) (Year: 2009).*

The International Search Report and Written Opinion of PCT/US2019/057802 dated Feb. 7, 2020.

Muller et al., "Influence of ensemble surrogate models and sampling strategy on the solution quality of algorithms for computationally expensive black-box global optimization problems", Journal of Global Optimization, 60 (2014), p. 123-144.

Muller et al., "SO-MI: A surrogate model algorithm for computationally expensive nonlinear mixed-integer black-box global optimization problems", Computers & Operations Research 40 (2013), p. 1383-1400.

Muller, "MISO: mixed-integer surrogate optimization framework", Optimization and Engineering 17 (2016), p. 177-203.

Cozad et al., "Learning surrogate models for simulation-based optimization", AIChE Journal 60 (2014), p. 2211-2227.

Wilson et al., "The ALAMO approach to machine learning", Computers & Chemical Engineering (2017), p.

Cozad et al., "A combined first-principles and data-driven approach to model building", Computers & Chemical Engineering 73 (2015), p. 116-127.

* cited by examiner

SURROGATE MODEL FOR A CHEMICAL PRODUCTION PROCESS

CROSS-REFERENCE TO RELATED APPLICATIONS

This application claims priority to U.S. Provisional Application Ser. No. 62/772,268 filed Nov. 28, 2018, which is incorporated herein by reference in its entirety.

FIELD

Modeling a chemical production process. The chemical production process can include refining oil into gasoline and/or other products.

BACKGROUND

Simulation of a chemical production process involves using specialized software to define physical characteristics of interconnected equipment and processes that form the chemical production process. Chemical production modeling requires a knowledge of the properties of the chemicals input and generated within different portions of the process, as well as the physical properties and characteristics of the components of the system, such as tanks, pumps, pipes, reactors, distillation columns, heat exchanges, pressure vessels, and so on. Knowledge of the physical properties allows the model to simulate flow rates, pressure drop, heat loss, and the chemical reactions that will occur under the given conditions. The simulation is constrained by the physical characteristics of the system and operating conditions within the system to simulate the output of the production process given an input.

Surrogate models that are not directly constrained by physical characteristics have been explored. For example, WO 2011059537 to Xiao-Hui Wu et. al, (hereafter Wu), describes a surrogate model as "a substitute to a given physical model such that it provides output similar to the given model at a faster speed. A surrogate can be created by using different methods, such as data regression, machine learning, reduced order modeling, reduced physics modeling, . . . ." Wu at [0064].

SUMMARY

Aspects of the technology described herein comprise a surrogate model for a chemical production process. The surrogate model described herein improves previous surrogate models by constraining results to plausible real-world solutions. A surrogate model is a machine learned model that uses a collection of inputs and outputs from a simulation of the chemical production process and/or actual production data as training data. Once trained, the surrogate model can estimate an output of a chemical production process given an input to the process. A surrogate model can be contrasted with the simulation. As used herein, a simulation of a chemical production process calculates probable outputs of one or more chemical reactions at specified physical conditions within a production environment. Combining a series of these calculations allows the simulation to show a reasonable output, given an input. A simulation is constrained by physical conditions in the plant. The simulation is computationally intensive, while the surrogate model is much less computationally intensive.

Surrogate models are not directly constrained by physical conditions in a plant. This can cause them to suggest optimized outputs that are not possible to produce in the real world. For example, given an input feed, such as a collection of crude oils, a refinery may produce a series of products using the available equipment. The available equipment may have capacity constraints that are not built into the surrogate model directly. For example, if jet fuel is one output and the capacity of the equipment used to make the jet fuel in a first configuration is 1000 gal/hr, then, in the real world, the plant can produce up to 1000 gal/hr, but can not produce 1200 gal/hr. Accordingly, though the relationship between the input and output may be linear, not all points on a line (or plane) may be viable solutions. It is a significant challenge to train a surrogate model to only produce outputs that are possible. The technology described herein improves upon previous surrogate models by constraining the output of the surrogate model to outputs that are possible in the real world.

At a high level, building the surrogate model can comprise the steps of collecting training data, training the model, running the model, testing the model output for quality, and then using the quality testing data to update the model, if needed. Much of the following disclosure is described in the terms of an oil refinery, which is one applicable chemical production process. However, the surrogate model can also be applied to other processes and is not limited to refining oil, also described as hydrocarbon processing.

DETAILED DESCRIPTION

Overview

Figure 1:
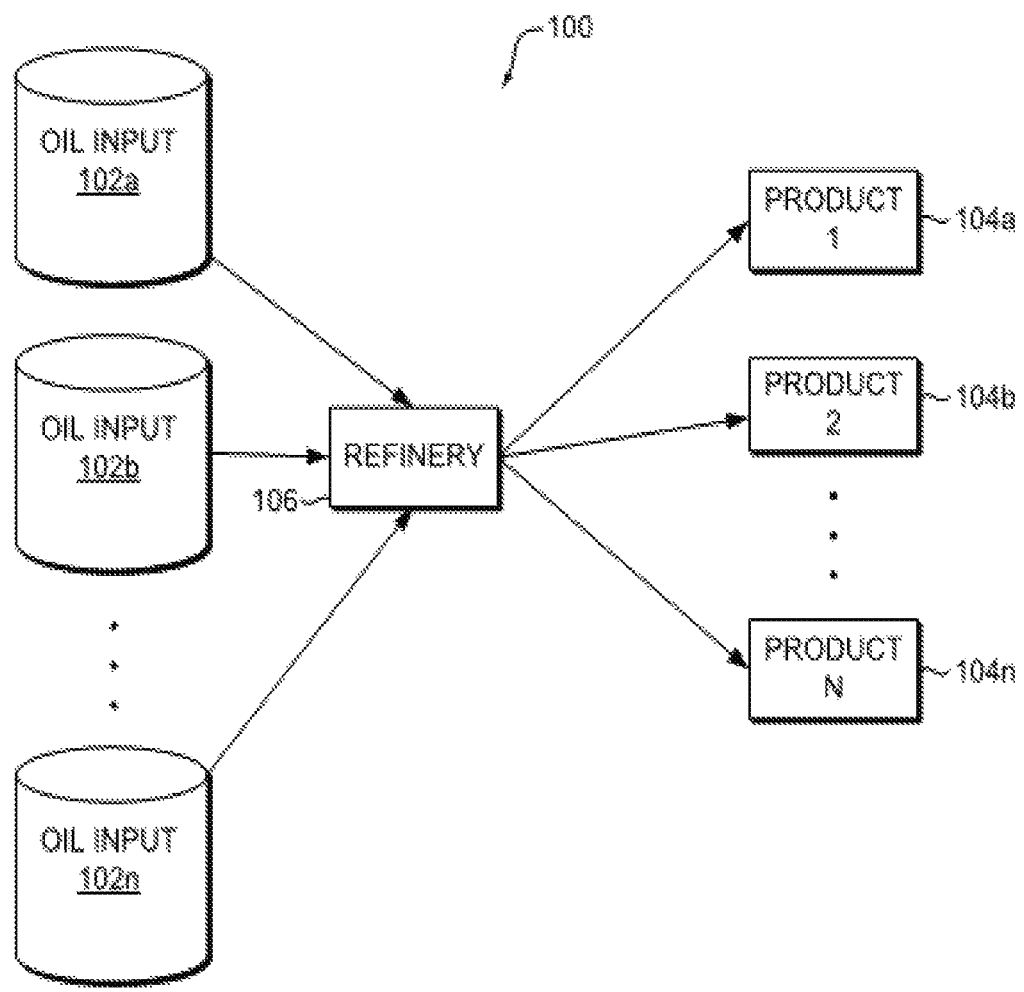
FIG. 1 is a diagram showing an exemplary chemical production process that could be modeled, according to an aspect of the technology described herein.

Aspects of the technology described herein comprise a surrogate model for a chemical production process. A surrogate model is a machine learned model that uses a collection of inputs and outputs from a simulation of the chemical production process and/or actual production data as training data. Once trained, the surrogate model can estimate an output of a chemical production process given an input to the process. A surrogate model can be contrasted with the simulation. As used herein, a simulation of a chemical production process calculates probable outputs of one or more chemical reactions at specified physical conditions within a production environment. Combining a series of these calculations allows the simulation to show a reasonable output, given an input. A simulation is constrained by physical conditions in the plant. The simulation is computationally intensive, while the surrogate model is much less computationally intensive.

Surrogate models are not directly constrained by physical conditions in a plant. This can cause them to suggest optimized outputs that the not possible to produce in the real world. For example, given an input feed, such as a collection of crude oils, a refinery may produce a series of products using the available equipment. The available equipment may have capacity constraints that are not built into the surrogate model directly. For example, if jet fuel is one output and the capacity of the equipment used to make the jet fuel in a first configuration is 1000 gal/hr, then, in the real world, the plant can produce up to 1000 gal/hr, but can not produce 1200 gal/hr. Accordingly, though the relationship between the input and output may be linear, not all points on a line (or plane) may be viable solutions. It is a significant challenge to train a surrogate model to only produce outputs that are possible. The technology described herein improves upon previous surrogate models by constraining the output of the surrogate model to outputs that are possible in the real world.

A surrogate model can be used both for predicting revenue/profit ($) and product quantities (barrel/day). A surrogate model can be used to guide purchasing decisions by estimating profits (or revenue) that will result from a contemplated purchase of an input to the chemical process. As such, the costs (e.g., purchase, transport, storage) of an input and sale price of an output product can be included in the surrogate model. Alternatively, the revenue/profit ($) can be calculated as a subsequent step, having calculated the likely output quantities from a process given a proposed input.

At a high level, building the surrogate model can comprise the steps of collecting training data, training the model, running the model, testing the model output for quality, and then using the quality testing data to update the model, if needed. Much of the following disclosure is described in the terms of an oil refinery, which is one applicable chemical production process. However, the surrogate model can also be applied to other processes and is not limited to refining oil, also described as hydrocarbon processing.

Turning now to FIG. 1, a high level process diagram of an oil refining processes is shown. Use of the surrogate model described herein is not limited to oil refining, but the description will largely been described in context of oil refining to help the reader understand the model.

This discussion generally relates to tools and methods for analyzing an optimized solution (or solutions) generated from models of hydrocarbon processing systems. The models can be related to individual processes or multiple (optionally related) processes. In some aspects, multiple processes can correspond to processes within a single hydrocarbon processing facility, or the processes can correspond to multiple facilities, including but not limited to models for optimizing an objective across multiple facilities. In this discussion, reference may be made to hydrocarbon processing. Unless specifically noted otherwise, it is understood that hydrocarbon processing generally includes processes typically involved in extraction, conversion, and/or other refining of petroleum, and processes typically involved in production, separation, purification, and/or other processing of chemicals based on hydrocarbon or hydrocarbon-like feeds. Examples of processes related to refining of hydrocarbons include any processes involved in production of lubricants, fuels, asphalts, and/or other products that can generally be produced as part of a petroleum processing workflow. Examples of processes related to chemicals production include any processes related to production of specialty chemicals, polymers (including production of feeds for polymer production), synthetic lubricants, and/or other products that can generally be produced as part of a hydrocarbon-based chemicals production workflow.

In this discussion, hydrocarbon processing is defined to include processing of and/or production of streams containing hydrocarbons and hydrocarbonaceous or hydrocarbon-like compounds. For example, many mineral petroleum feeds and bio-derived hydrocarbon feeds contain substantial quantities of compounds that include heteroatoms different from carbon and hydrogen. Such heteroatoms can include sulfur, nitrogen, oxygen, metals, and/or any other type of heteroatom that may be found in a mineral petroleum feed and/or bio-derived hydrocarbon feed. As another example, some chemical production processes involve reagents corresponding to alcohols and/or other organic compounds that contain heteroatoms other than carbon and hydrogen. Still, other refinery processes and/or chemicals production processes may involve production of products that are not hydrocarbons, such as reforming processes that convert hydrocarbon or hydrocarbon-like compounds to generate hydrogen, water, and carbon oxides as products. Yet other processes may form hydrocarbon or hydrocarbon-like compounds from reagents such as hydrogen, water, and carbon oxides. It is understood by those of skill in the art that all of the above types of processes are intended to be included within the definition of hydrocarbon processing in this discussion.

FIG. 1 shows a hydrocarbon refining system 100. The refining system 100 represents a real-world system of equipment that processes real oil to produce real products. The surrogate model system 200 estimates the performance of the refining system 100. The refining system 100 includes tank oil volumes 102a, 102b, and 102n as input. The 102n volume indicates that the many more than three different types of oil volumes can be used. Each oil volume can be a different type of oil, though some of the oil volumes input to the refinery may be the same type. For example, the purchase of two tankers of Arab Light Crude could result in two volumes of similar oil.

Each oil volume may represent a bulk purchase of oil having roughly similar characteristics. Bulk purchase can include a tanker of oil or a purchase from a pipeline. Each oil volume can have unique molecular and chemical characteristics measured by an assay. No two crude oil types are identical and there are crucial differences in crude oil quality. The results of crude oil assay testing provide extensive detailed hydrocarbon analysis data for refiners. Assay data helps refineries determine if a crude oil feedstock is compatible for a particular petroleum refinery or if the crude oil could cause yield, quality, production, environmental, and/or other problems.

The oil volume's molecular characteristics measured in an assay can include the % by weight of different molecules such as, methane, ethane, propane, isobutene, n-butane, isopentane, n-pentane, cyclopentane, C6 paraffins, C6 naphthenes, benzene, C7 paraffins, C7 naphthenes, and toluene. Measured properties can include, but are not limited to, Density @ 15° C. (g/cc), API Gravity, Total Sulphur (% wt), Pour Point (° C.), Viscosity @ 20° C. (cSt), Viscosity @ 40° C. (cSt), Nickel (ppm), Vanadium (ppm), Total Nitrogen (ppm), Total Acid Number (mgKOH/g), Mercaptan Sulphur (ppm), Hydrogen Sulphide (ppm), and Reid Vapour Pressure (psi). The price per volume can also be considered as an oil volume characteristic. Each oil volume can be measured in barrels or some other suitable unit.

The refinery 106 can be a single refinery or a collection of refineries. The oil volumes are input to the refinery 106, which processes the oil to produce products 104a, 104b, and 104n. The products 104a, 104b, and 104n can include petroleum naphtha, gasoline, diesel fuel, asphalt base, heating oil, kerosene, liquefied petroleum gas, jet fuel, and fuel oils. Different refinery set ups and different oil inputs can produce different combinations of products. Roughly 1 barrel of input should allow the refinery to produce roughly 1 barrel of combined products.

Figure 2:
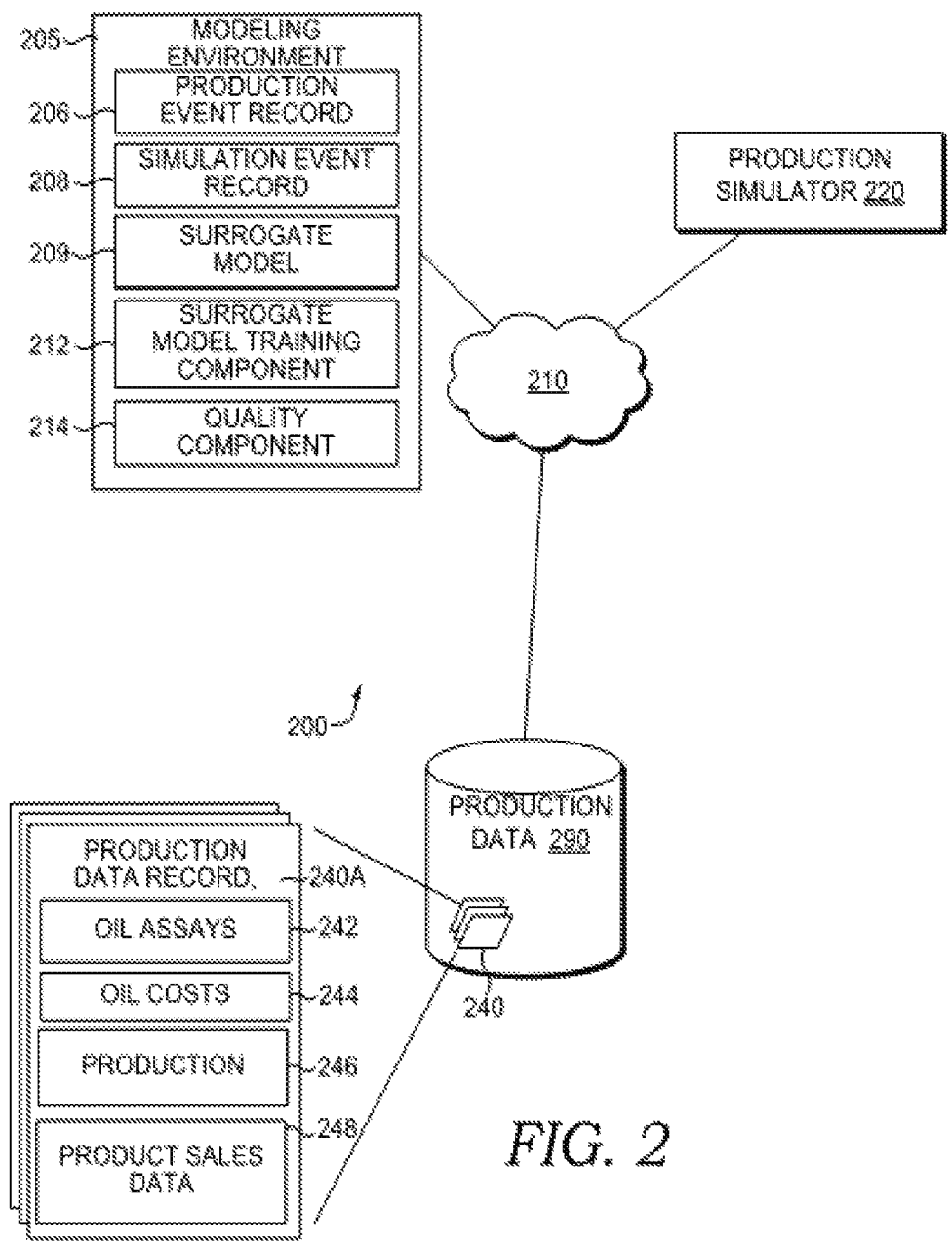
FIG. 2 is a diagram showing a surrogate model system for a chemical production process, according to an aspect of the technology described herein.

Turning now to FIG. 2, a block diagram is provided illustrating an exemplary surrogate model system 200 in which some embodiments of the present disclosure may be employed. The components of surrogate model system 200 may be embodied as a set of compiled computer instructions or functions, program modules, computer software services, or an arrangement of processes carried out on one or more computer systems, such as computing device 800 described in connection to FIG. 8, for example.

In one embodiment, the functions performed by components of surrogate model system 200 are associated with one or more applications, services, or routines. In particular, such applications, services, or routines may operate on one or more user devices (e.g., personal computers, tablets, desktops, laptops) and servers, may be distributed across one or more user devices and servers, or be implemented in the cloud. Moreover, in some embodiments, these components of surrogate model system 200 may be distributed across a network 210, including one or more servers and client devices, in the cloud, or may reside on a user device. Moreover, these components, functions performed by these components, or services carried out by these components may be implemented at appropriate abstraction layer(s) such as the operating system layer, application layer, hardware layer, etc., of the computing system(s). Alternatively, or in addition, the functionality of these components and/or the embodiments of the disclosure described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc. Additionally, although functionality is described herein with regard to specific components shown in example surrogate model system 200, it is contemplated that in some embodiments functionality of these components can be shared or distributed across other components.

As noted above, it should be understood that the surrogate model system 200 shown in FIG. 2 is an example of one system in which embodiments of the present disclosure may be employed. Each component shown may include one or more computing devices. The surrogate model system 200 should not be interpreted as having any dependency or requirement related to any single module/component or combination of modules/components illustrated therein. Each may comprise a single device or multiple devices cooperating in a distributed environment. For instance, the surrogate model system 200 may comprise multiple devices arranged in a distributed environment that collectively provide the functionality described herein. Additionally, other components not shown may also be included within the network environment. It should be understood that the surrogate model system 200 and/or its various components may be located anywhere in accordance with various embodiments of the present disclosure.

The surrogate model system 200 generally operates to build and operate a surrogate model 209 for a chemical production process. As briefly mentioned above, each component of the surrogate model system 200, including modeling environment 205, production simulator 220, production data store 290, production data event records 240, and their respective subcomponents, may reside on a computing device (or devices). For example, the components of the surrogate model system 200 may reside on the exemplary computing device 800 described below and shown in FIG. 8, or similar devices. Accordingly, each component of the surrogate model system 200 may be implemented using one or more of a memory, a processor or processors, presentation components, input/output (I/O) ports and/or components, radio(s), and a power supply (e.g., as represented by reference numerals 812-824, respectively, in FIG. 8).

The production simulator 220 calculates probable outputs of one or more chemical reactions at specified physical conditions within a production environment. Combining a series of these calculations allows the simulation to show a probable output, given an input. A simulation is constrained by physical conditions in the plant. The production simulator 220 can run thousands of different simulations with different inputs and/or operating conditions. The inputs can be a combination of different oil types. Each oil type can be defined by an oil assay. Each simulation can produce a unique output expressed as a volume of different products produced.

The production data store 290 stores production data for the refinery system. Production data can be any information about the inputs, production, and production outputs of the refinery. In one aspect, the production data forms a series of production data event records 240, such as production data record 240A. The production data record 240A can represent production data for a period of time such as a day, week, month, or some other unit of time. The production data record can include oil assays 242 for the oil input to the refinery system during the time memorialized in the production data record 240A. As mentioned, a refinery may work on a combination of different oil inputs at a given time. The production data record 240A can include the characteristics of each oil input, such as oil input volumes described previously with reference to FIG. 1, and the volume of each type of oil introduced to the refinery.

Financial data 244 for the oil input to the refinery can be recorded in the production data record 240A. The financial data 244 can include the actual amount paid for each type of oil input to the refinery during the timeframe associated with production data record 240A. In addition to the actual purchase costs, the financial data 244 can include relevant transportation costs, storage costs, and other financial data that helps provide an accurate measure of cost associated with the oil input to the refinery.

The production data 246 describes the type of products made by the refinery during the timeframe associated with the production data record. Each type and volume of product produced can be described. The product sales data 248 describes the sales price obtained for each product produced. The production sales data can include transportation and storage costs. The production sales data can include a storage time for each product produced. The storage time is a duration of time the product spent in storage between production and sale. This is just one example of production data record 240A. The production data store 290 can include any information that describes the refinery inputs, outputs, production setups, and financial data related to any aspect of production. When multiple refineries are modeled, each production record can specify a particular refinery associated with the production data.

The modeling environment 205 includes a production event record component 206, simulation event record component 208, a surrogate model component 209, a surrogate model training component 212, and a quality component 214. The modeling environment 205 generates an estimated output of a refinery for a given input. Various machine learning models may be used to implement the surrogate model. Implementations using a regression surrogate, neural network, and convex hull models are described below. At a high level, the optimization problem solved for by a simulation can be:

$$x_{opt} = \arg\max_x f(x,c)$$

$$s.t. g(x,c) \leq 0$$

The function can be solved to maximize different variables. In the case of raw material valuation, the objective function f is the profit the decision variable x may include, for example, crude quantities and feedstock quantities. The conditions c can include crude price, product price, compositional data, and unit capacity.

The model can be trained using production event records or simulation event records. Accordingly, an initial step is to gather the training data. The production event record component 206 gathers production data and forms production event records that can be used to train the surrogate model 209. The production event record can follow a schema for production data that allows production data to be input as training data. Each production event record can represent an input to the refinery and an output.

The input and output can be represented as multi-dimensional vectors. For example, a single vector could represent a single oil input to a refinery at a particular point in time associated with an event record. The dimensions in the input vector could represent oil assay variables, cost variables, and other features of the oil input, such as the volume of a particular input. The production output can also be represented as a vector with variables representing characteristics and volumes of the various products produced. The production event records can include inferences. For example, the inputs in a record can be matched to time-shifted outputs. As an example, if it takes one day for a refinery to process a barrel of oil, then the output from a day could be matched with inputs from a previous day.

The simulation event record component 208 builds simulation event records. The simulation event records can follow the same schema as the production event records. Like the production event records, the simulation event records can be represented as multi-dimensional vectors. The simulation event records can include data from a computer simulation of a production process, such as those generated by production simulator 220. The simulations can be performed for the express purpose of generating training data, but can also include data from simulations run during optimization exercises or for any other purpose in the course of running simulations. It is desirable to collect simulation event records that cover a large number of possible model conditions. Both x and c in the objective function can be high-dimensional inputs, such as vectors with 100 or more dimensions. As an example, x in the case of a refinery can be a vector that specifies amounts of different constituents in and characteristics (e.g., viscosity, density) of the crude oil mixture being fed to the refinery for processing.

Simulation event records used to train the model can be produced with constraints that mimic conditions in which the refinery is actually operated. Events generated from simulations that are not near conditions actually used in the real world may have less value. Aspects of the technology can focus event generation in a neighborhood of a typical refinery operating point of the input variables x and the conditions c.

The goal is to generate a plurality of event records that contain a large fraction of feasible solutions. The following approach can be used to efficiently generate a sample set with only feasible solutions. The conditions can be partitioned into conditions $c\_\alpha$ that determine the constraints, and the remaining conditions $c\_\beta$ that do not act as constraints. This approach for generating event records from simulations can be expressed as:

$$g(x,c) = g'(x, c\_\alpha)$$

For example, for the refinery model, crude and product prices do not enter into the constraints and can therefore be a component of the partition $c\_\beta$.

Initially, a sample $c\_(\alpha,i)$ of the conditions $c\_\alpha$ that allow a feasible solution x_opt can be generated. This step may be challenging for a given problem. In order to proceed with this algorithm, an assumption can be made that at least one value $c\_(\alpha,0)$ that fulfils this requirement exists. It is reasonable to expect that a $c\_(\alpha,0)$ can be obtained using domain knowledge. Domain knowledge is an understanding of real-world operating ranges within the refinery. The domain knowledge can include a knowledge of physical constraints within the refinery, such as an equipment's maximum capacity. Domain knowledge can also include a knowledge of typical operating ranges. For example, some equipment may typically run at 75% of maximum throughput.

Next, random conditions $c\_(\beta,i)$ that do not violate limits and other observed relations/expectations are generated, again relying on domain knowledge.

The sample x_i for the input space is equal to the optimal decision variables:

$$x\_i = x\_(\text{opt},i).$$

The next step in sample generation can be to compute the objective function under different conditions $c\_\beta = c\_\beta\hat{}+:f^*(x\_i,(c\_(\alpha i)\ c\_\beta\hat{}+))$. The conditions $c\_\beta\hat{}+$ should match the conditions under which the model is used. Using different conditions ensure that the samples include solutions that are suboptimal for the conditions $c\_i\hat{}+$. This is important because the surrogate model has to provide a useful answer outside of the optimal solution. At the same time, feasibility is guaranteed because $c\_(\alpha,i)$ is kept constant. Once a suitable sample set is generated, the machine learning model can be trained.

The surrogate model training component 212 trains the surrogate mode using the simulation and production of event records. Different types of models can be used and the training can vary according to the model.

The various models may use constraints. Constraints limit the value assigned to variables being optimized in the objective function used by the surrogate model. Constraints can be either hard constraints, which set conditions for the variables that are required to be satisfied, or soft constraints, which have some variable values that are penalized in the objective function if, and based on the extent that, the conditions on the variables are not satisfied. In one aspect, linear constraints are used. If all the terms of a constraint are of the first order, the constraint is said to be linear. This means the constraint doesn't contain a variable squared, cubed, or raised to any power other than one, a term divided by a variable, or variables multiplied by each other. The constraints may also be non-linear. In one aspect, a box constraint is used. The box constrained may be represented as min {f(x) such that $1 \leq x \leq u$} where 1 is a vector of lower bounds, and u is a vector of upper bounds.

The Linear Regression Based Surrogate

The linear regression based surrogate works by substituting the objective function and constraints by data-based (piece-wise) linearized approximations. The resulting optimization problem is a linear program or a mixed integer linear program, which can be solved relatively efficiently with optimization software. A linear regression model assumes a linear relationship between the input variables and the output. In a simple regression model, the form of the model could be y=B0+B1*x, where B0 and B1 are coefficients. Training the regression model means learning the values of the coefficients used in the representation.

In one aspect, the overall objective function can be split into multiple functions. For example, the objective function can be split into two contributions:

$$f(x,c)=f^*(x,c_1)+L(x,c_2)$$

where L is linear in $x_2$; $c_1$ and $c_2$ are subvectors of c, i.e. $c=(c_1\ c_2)$. For example, in the case of raw material valuation, the crude cost is linear in the crude quantities (cost=price*quantity) and is therefore an example of a linear function L. The benefit of this step is that it reduces the difficulty of the surrogate modeling task while maintaining high model quality. Also, this linear component typically has an interpretable meaning, e.g., the crude cost in the example given.

Different methods exist for calculating the coefficients. These methods include simple linear regression, ordinary least squares, gradient descent, and regularization methods. Regularization methods seek to both minimize the sum of the squared error of the model of the training data using ordinary least squares and also to reduce the complexity of the model. Regularization training methods include the lasso regression and the ridge regression. The lasso regression modifies the ordinary least square training method to minimize the absolute sum of the coefficients (B0+B1). The ridge regression modifies the least square regression method to minimize the squared absolute sum of the coefficients.

Once the coefficients are calculated, solving the model comprises solving the equation for a specific set of inputs x. However, because of the nature of the modeling problem, some solutions may not be feasible. The technology described herein solves this problem by adding constraints to the solutions.

Figure 3:
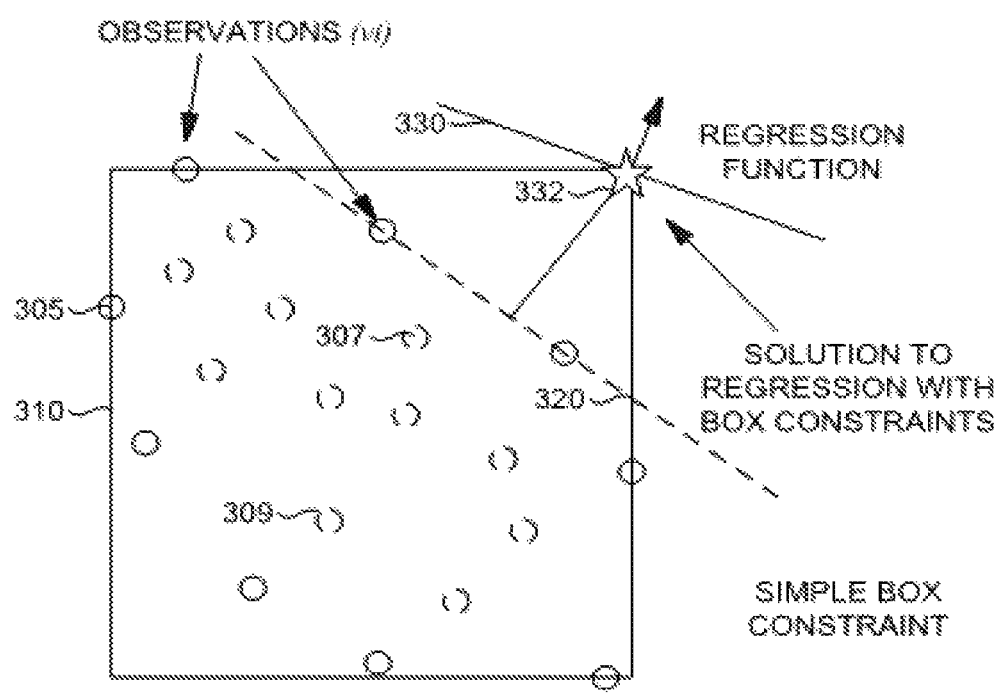
FIG. 3 is a diagram showing a plot of result data points from model training data along with constraints used to limit model output to solutions that are viably produced by a chemical production process, according to an aspect of the technology described herein.

FIG. 3 shows a visual representation of the solution space for a trained linear regression model 300. The solution space includes result observations 305, 307, and 309 representing outputs taken from simulation or production event records. As an initial step, the solution space can be limited by constraints, such as box constraint 310. Different constraints may be used. For example, constraints can be used to limit the input space to a maximum and minimum value observed in the training data. Other constraints are possible, for example, a relationship between a volume of input equaling a volume of output could form another constraint. As mentioned, the input space can be multi-dimensional and the constraint can be applied to each dimension or in combination, such as a sum of input dimensions describing a volume of input (in contrast to dimensions describing characteristics, such as viscosity).

A further constraint can be calculated by calculating a hyperplane 320. As a starting point, the hyperplane can be generated by (randomly) selecting a set of crude and product prices, resulting in a regression function that results in the optimization solution 332. If this solution is infeasible when applied to the full exact refinery model, we can add the hyperplane 320 to eliminate the infeasible solution. The process can be repeated until the solution space is suitably narrowed. In one aspect, the quality testing method described below is used to determine if the space has been suitably narrowed, for example, generation of hyperplanes can cease when the model achieves the desired performance threshold.

Figure 4:
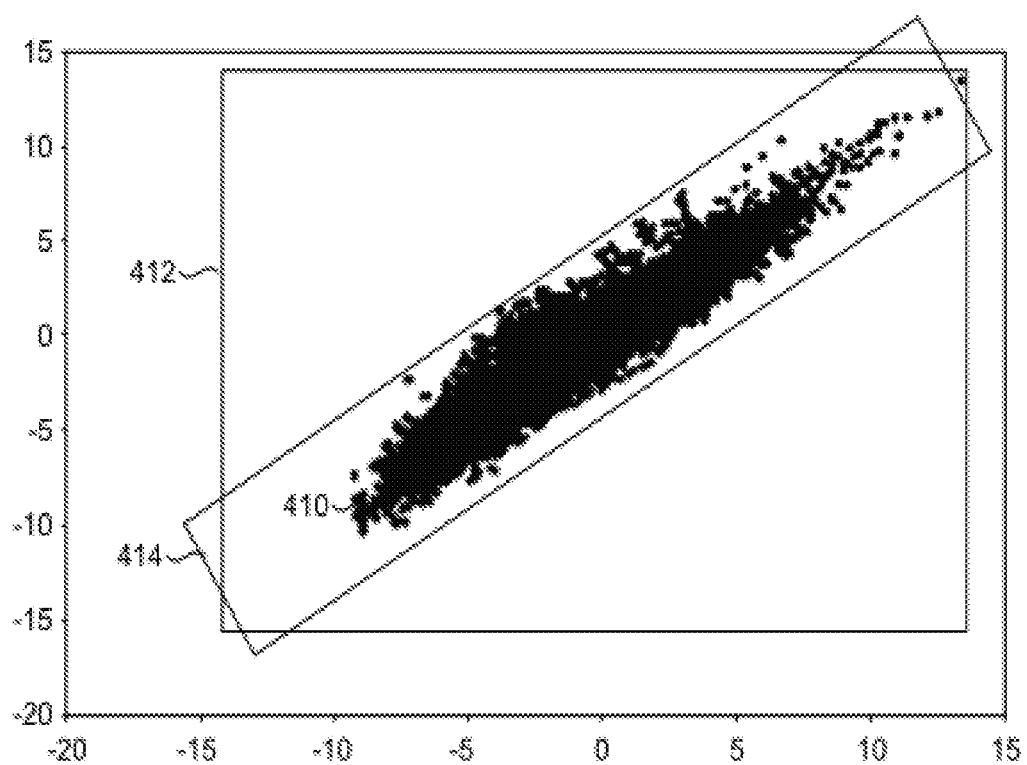
FIG. 4 is a diagram showing constraints used to limit model output to solutions that are viably produced by a chemical production process, according to an aspect of the technology described herein.

Another method of generating constraints is performing eigen-value decomposition on the sample covariance matrix of the training dataset 410 shown depicted on graph 400 in FIG. 4. The training data can be projected on the eigen vectors. An additional constraint 414 can be derived from the transformed dataset. The additional constraint 414 more closely fits the training dataset 410, than the original simple box constraint 412.

Neural Network Based Surrogate

In one aspect, the surrogate model is a neural network. As used herein, a neural network comprises at least three operational layers. The three layers can include an input layer, a hidden layer, and an output layer. Each layer comprises neurons. The input layer neurons pass data to neurons in the hidden layer. Neurons in the hidden layer pass data to neurons in the output layer. The output layer then produces a result, such as estimated profit, estimated production cash flow, estimated production volumes, etc. Different types of layers and networks connect neurons in different ways. For example, some layers may be fully connected where every output from a neuron in a first layer is fed to every neuron in a subsequent layer. In other cases, outputs from a neuron in a first layer are only fed to less than all of the neurons in a subsequent layer.

Neurons have weights, an activation function that defines the output of the neuron given an input (including the weights), and an output. The weights are the adjustable parameters that cause a network to produce a correct output. The weights are adjusted during training. Once trained, the weight associated with a given neuron can remain fixed. The other data passing between neurons can change in response to a given input (e.g., group of oil assays). Retraining the network with an additional training data can update one or more weights in one or more neurons.

The neural network may include many more than three layers. Neural networks with more than one hidden layer may be called deep neural networks. Example neural networks that may be used with aspects of the technology described herein include, but are not limited to, multilayer perceptron (MLP) networks, convolutional neural networks (CNN), recursive neural networks, recurrent neural networks, and long short-term memory (LSTM) (which is a type of recursive neural network).

The neural network is trained by feeding production event records and simulation event records to the model. In one aspect, the input layer to the neural network can include a single neuron for each feature describing the oil inputs to the process. Additional neurons can operate on cost data. The output from the production or simulation record is then provided by the surrogate model training component 212. The weights are adjusted so that the given input comes closer to producing the desired output. This process is repeated with numerous training records. Once trained, the neural network will estimate refinery output for a given oil input.

The quality component 214 tests the accuracy of the trained model. In one aspect, a subset of available simulation event records or production event records are set aside for testing. The simulation event records and production event records provide an accurate output for a given input. In order to test the trained model, the input from a production or simulation event record can be provided to the model. The output calculated by the model can then be compared to the output associated with the input in the event record. This process can be repeated to generate an estimated model error. Depending on the error, the model could be retrained. In one aspect, models can underperform with certain types of inputs, especially if they do not match inputs found in the training data. In this case, additional training data near the inputs that produced a large or undesirable error rate can be intentionally generated, for example, by running simulations, and used to retrain the model.

Convex Hull Based Surrogate

In another aspect, the surrogate model uses a convex hull calculation to model the solution space. As described previously, the training data includes both input and output sets. The input sets can be characteristics of different crude oils being fed to the refinery. The outputs can be the products produced. Financial data can be included for both the inputs and outputs. The training data can be used to build a convex hull, which is a representation of the solution space. If X is the set of all decision variables in the training data, then the convex hull is the minimal convex set that contains all points in X. The convex hull will include all points in the training data and additional points that are not in the training data output sets. Once calculated, the convex hull can be used to predict a solution for an input that is not in the training data. Constraints may be used to keep the input within ranges that are consistent with the space modeled by the convex hull.

As mentioned, the input to the surrogate model can be multi-dimensional. For example, the input can be defined as a combination of different crude oil characteristics. If ten different crude oils are being fed into the refinery and each crude is described by ten different characteristics, then the input space for the convex hull model has 100 dimensions. In some aspects, it may be advantageous to reduce the model complexity by characterizing types of crudes in the input. In the above example, if each oil in the input is represented by a single characterization, then this could reduce the input dimensions from 100 to 10. The crude oil inputs could be grouped by characteristics used in the market to describe the origin on the oil, such as West Texas crude (WTI), Brent Blend, or OPEC crude. Other grouping by similar physical characteristics of different crudes may be used. The characteristics of different batches (e.g., tankers) of oil from these sources can vary, but characteristics of different batches can be similar enough to find an optimized solution with the surrogate model.

Another approach to reducing the input dimensions can be to preprocess the input data to generate an estimate of composite characteristics of a crude oil blend to be modeled. For example, if 10 different crudes are mixed into a refinery for processing, then a composite density, composite sulfur content, composite cost/barrel, etc. can be calculated. The characteristics found to have the strongest correlation to a modeled output can be selected to define the input space. For example, only the six most strongly correlated characteristics may be input to the model.

In one aspect, the output space can be multi-dimensional. For example, the output space could be represented by different volumes of het fuel, kerosene, gasoline, etc. Alternatively, the output could be represented as percentage of different products produced per barrel of oil input (e.g., 5% jet fuel, 30% gasoline).

In another aspect, the output space can be reduced to a single dimension by using financial data as a proxy for a more complex representation of the output. For example, the output could be expressed as revenue/barrel of input or profit/barrel of input.

If an approach is used to reduce the dimensions of the input or output space, then the same approach should be used on the training data and the input set used to generate the convex hull model.

Selecting the training data can be an important part of the model building process. The training data can be selected using knowledge of the chemical production process. In one aspect, only simulation event records falling within a range from a normal operating range found in real-world operations are selected for training. Simulations may be run for various reasons including to test operating conditions that are not likely to be found in the real world. For example, some simulations may demonstrate the benefit of not running the process in certain ranges. Simulations that demonstrate a poor performance may be described as negative simulations. They may illustrate ranges at which the process should not be operated.

The negative simulations may be excluded from a training set. The actual training set may be limited to event records having simulation inputs within a range from actually observed inputs in the real-world production process. The range may be set using knowledge of the chemical production process and can vary from limitation to limitation. In one aspect, the range is $\frac{1}{8}$ of a standard deviation from the average input found in an operating scenario.

A chemical production process may have different operating scenarios. For example, a first scenario may use a first type of oil as a primary input with four other types mixed in. In this case, the percentage of each type of oil may be an input and the percentage of each may fluctuate within a range designed to produce the optimal output. In a second scenario, none of the first type of oil may be input to the process. Instead, a second primary oil type is input to the process along with the four other types. The percentage of the four other types may be very different than in the first scenario in order to achieve an optimal result. In fact, the percentage ranges for different types of oil may not overlap in between scenarios. For example, in the first scenario, a third oil type may be between 15-20% of the input. In the second scenario, the third oil type may be between 5-10% of the input. Knowledge of the process can be used to identify different scenarios and reasonable ranges of inputs in each scenario. These ranges can then be used to select the training data.

Various algorithms may be used for calculating a convex hull of a solution set. Chan's algorithm can be used for two and three-dimensional cases. The Quickhull algorithm may be used in multi-dimensional cases. Use of other algorithms is possible, particularly if the output space is planar. In some instances, the vertices by themselves can be used to represent a convex hull in its "V-representation" without any algorithm.

Constraints can be placed on the input space to limit inputs to a feasible range. Alternatively, a notification can be issued if the input parameters to the model differ from the training data by more than a notification threshold.

Figure 5:
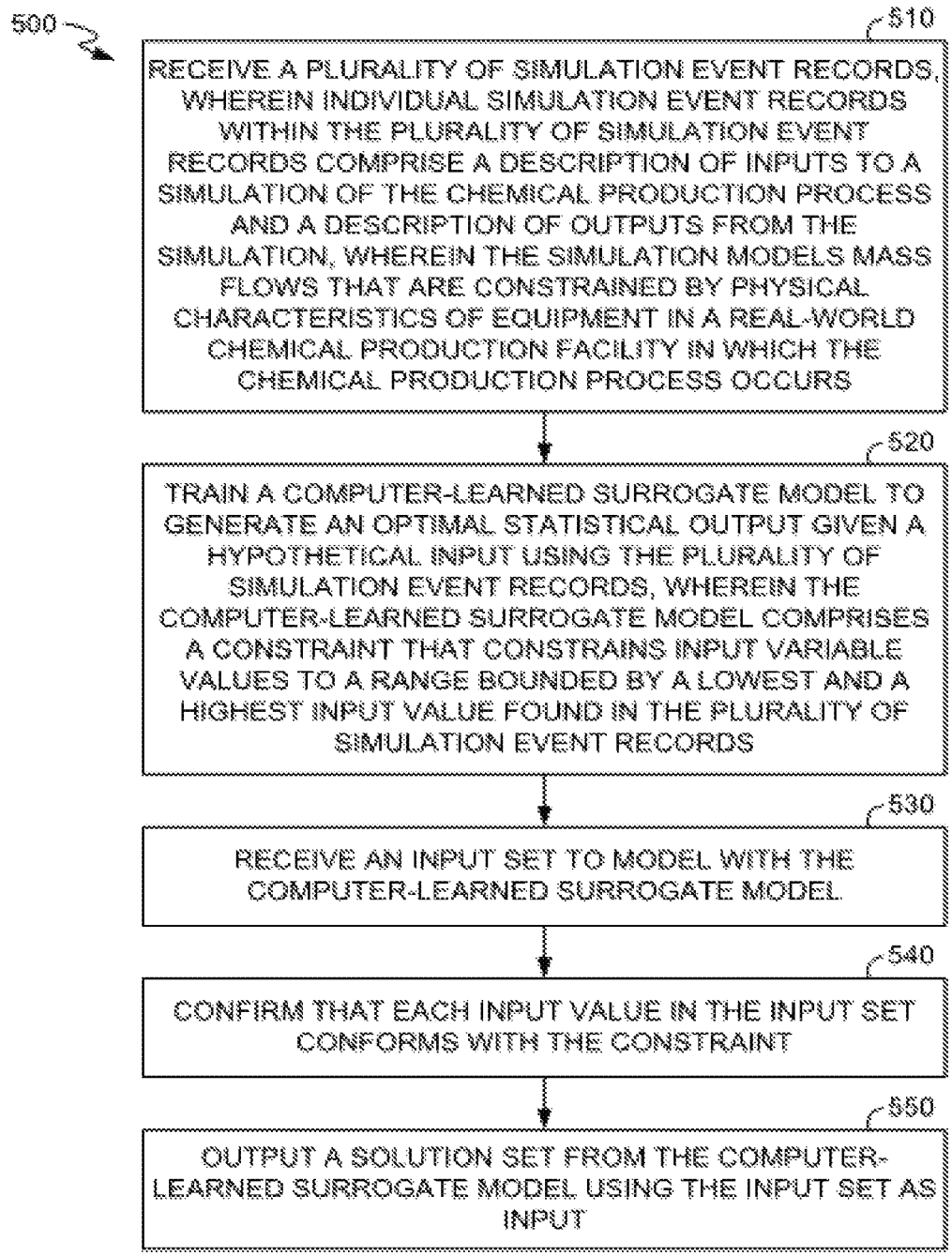
FIGS. 5-7 are flow charts for methods of modeling a chemical production process, according to an aspect of the technology described herein.

Turning now to FIG. 5, a method 500 for modeling a chemical production process is provided. Method 500 may be performed by a computing system similar to system 200 described previously.

At step 510, a plurality of simulation event records are received. The individual simulation event records within the plurality of simulation event records comprise a description of inputs to a simulation of the chemical production process and a description of outputs from the simulation. The simulation models mass flows that are constrained by physical characteristics of equipment in a real-world chemical production facility in which the chemical production process occurs. Simulation event records have been described previously with reference to the production simulator 220.

At step 520, a computer-learned surrogate model is trained to generate an optimal statistical output given a hypothetical input using the plurality of simulation event records. In one aspect, production data from the real-world chemical production process is also used as training data. The computer-learned surrogate model comprises a constraint that constrains input variable values to a range bounded by a lowest and a highest input value found in the plurality of simulation event records. The surrogate model may be a linear regression model, neural network, convex hull model, or some other suitable model. These models have been described previously with reference to FIGS. 2-4.

At step 530, an input set is received to model with the computer-learned surrogate model. The input set can be input by a user interested in testing a particular solution.

At step 540, each input value in the input set is analyzed to confirm it conforms with the constraint. Different constraints may be used. For example, constraints can be used to limit the input space to a maximum and minimum value observed in the training data. Other constraints are possible, for example, a relationship between a volume of input equaling a volume of output could form another constraint. As mentioned, the input space can be multi-dimensional and the constraint can be applied to each dimension or in combination, such as a sum of input dimensions describing a volume of input (in contrast to dimensions describing characteristics, such as viscosity).

A further constraint can be calculated by calculating a hyperplane 320. As a starting point, the hyperplane can be generated by (randomly) selecting a set of crude and product prices, resulting in a regression function that results in the optimization solution 332. If this solution is infeasible when applied to the full exact refinery model, we can add the hyperplane 320 to eliminate the infeasible solution. The process can be repeated until the solution space is suitably narrowed. In one aspect, the quality testing method described below is used to determine if the space has been suitably narrowed, for example, generation of hyperplanes can cease when the model achieves the desired performance threshold.

At step 540, a solution set is output from the computer-learned surrogate model using the input set as input. The solution set can be the optimal solution of the model for the given input. As mentioned, optimal can be defined as the maximum profit, maximum revenue, maximum generation of a particular finished product, or some other way.

In one aspect, a subset of available simulation event records or production event records are set aside for testing. The simulation event records and production event records provide an accurate output for a given input. In order to test the trained model, the input from a production or simulation event record can be provided to the model. The output calculated by the model can then be compared to the output associated with the input in the event record. This process can be repeated to generate an estimated model error. Depending on the error, the model could be retrained. In one aspect, models can underperform with certain types of inputs, especially if they do not match inputs found in the training data. In this case, additional training data near the inputs that produced a large or undesirable error rate can be intentionally generated, for example, by running simulations, and used to retrain the model.

Figure 6:
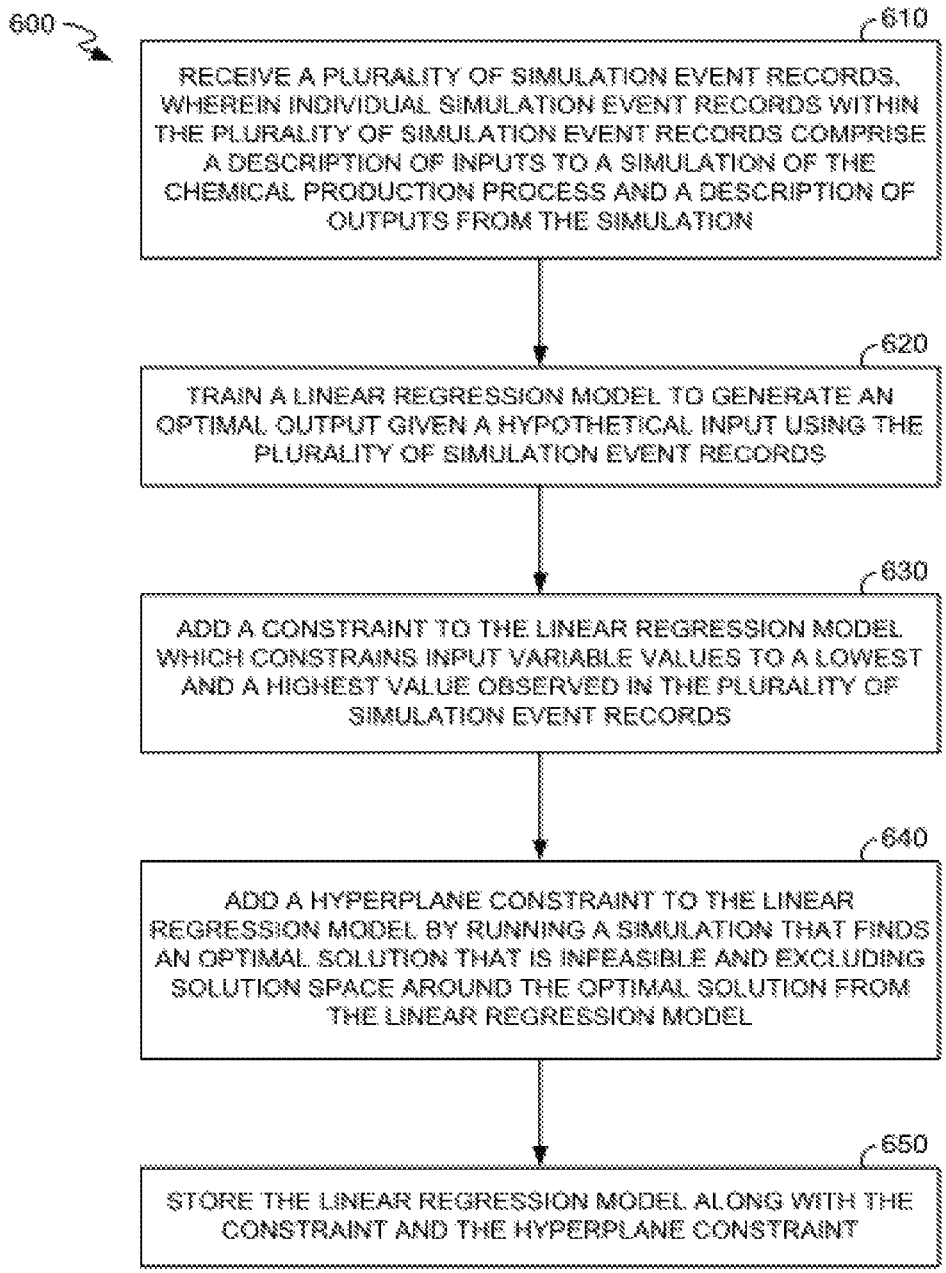

Turning now to FIG. 6, a method 600 for modeling a chemical production process is provided. Method 600 may be performed by a computing system similar to system 200 described previously.

At step 610, a plurality of simulation event records are received. The individual simulation event records within the plurality of simulation event records comprise a description of inputs to a simulation of the chemical production process and a description of outputs from the simulation. Simulation event records have been described previously with reference to the production simulator 220.

At step 620, a linear regression model is trained to generate an optimal output given a hypothetical input using the plurality of simulation event records. The linear regression based surrogate works by substituting the objective function (Eq. 1) and constraints by data-based (piece-wise) linearized approximations. The resulting optimization problem is a linear program or a mixed integer linear program, which can be solved relatively efficiently with optimization software. A linear regression model assumes a linear relationship between the input variables and the output. In a simple regression model, the form of the model could be y=B0+B1*x, where B0 and B1 are coefficients. Training the regression model means learning the values of the coefficients used in the representation.

In one aspect, the overall objective function can be split into multiple functions. For example, the objective function can be split into two contributions:

$$f(x,c) = f^*(x,c_1) + L(x,c_2)$$

where L is linear in $x_2$; $c_1$ and $c_2$ are subvectors of c, i.e. $c = (c_1\ c_2)$. For example, in the case of raw material valuation, the crude cost is linear in the crude quantities (cost=price*quantity) and is therefore an example of a linear function L. The benefit of this step is that it reduces the difficulty of the surrogate modelling task while maintaining high model quality. Also, this linear component typically has an interpretable meaning, e.g., the crude cost in the example given.

Different methods exist for calculating the coefficients. These methods include simple linear regression, ordinary least squares, gradient descent, and regularization methods, Regularization methods seek to both minimize the sum of the squared error of the model of the training data using ordinary least squares and also to reduce the complexity of the model. Regularization training methods include the lasso regression and the ridge regression. The lasso regression modifies the ordinary least square training method to minimize the absolute sum of the coefficients (B0+B1). The ridge regression modifies the least square regression method to minimize the squared absolute sum of the coefficients.

Once the coefficients are calculated, solving the model comprises solving the equation for a specific set of inputs x. However, because of the nature of the modeling problem, some solutions may not be feasible. The technology described herein solves this problem by adding constraints to the solutions.

At step 630, a constraint is added to the linear regression model which constrains input variable values to a lowest and a highest value observed in the plurality of simulation event records. Different constraints may be used. For example, constraints can be used to limit the input space to a maximum and minimum value observed in the training data. Other constraints are possible, for example, a relationship between a volume of input equaling a volume of output could form another constraint. As mentioned, the input space can be multi-dimensional and the constraint can be applied to each dimension or in combination, such as a sum of input dimensions describing a volume of input (in contrast to dimensions describing characteristics, such as viscosity).

At step 640, a hyperplane constraint is added to the linear regression model by running a simulation that finds an optimal solution that is infeasible and excluding solution space around the optimal solution from the linear regression model. As a starting point, the hyperplane can be generated by (randomly) selecting a set of crude and product prices, resulting in a regression function that results in the optimization solution. If this solution is infeasible when applied to the full exact refinery model, the hyperplane can be added to eliminate the infeasible solution. The process can be repeated until the solution space is suitably narrowed. In one aspect, the quality testing method described below is used to determine if the space has been suitably narrowed, for example, generation of hyperplanes can cease when the model achieves the desired performance threshold.

In one aspect, a subset of available simulation event records or production event records are set aside for testing. The simulation event records and production event records provide an accurate output for a given input. In order to test the trained model, the input from a production or simulation event record can be provided to the model. The output calculated by the model can then be compared to the output associated with the input in the event record. This process can be repeated to generate an estimated model error. Depending on the error, the model could be retrained. In one aspect, models can underperform with certain types of inputs, especially if they do not match inputs found in the training data. In this case, additional training data near the inputs that produced a large or undesirable error rate can be intentionally generated, for example, by running simulations, and used to retrain the model.

At step 650, the linear regression model is stored along with the constraint and the hyperplane constraint.

Figure 7:
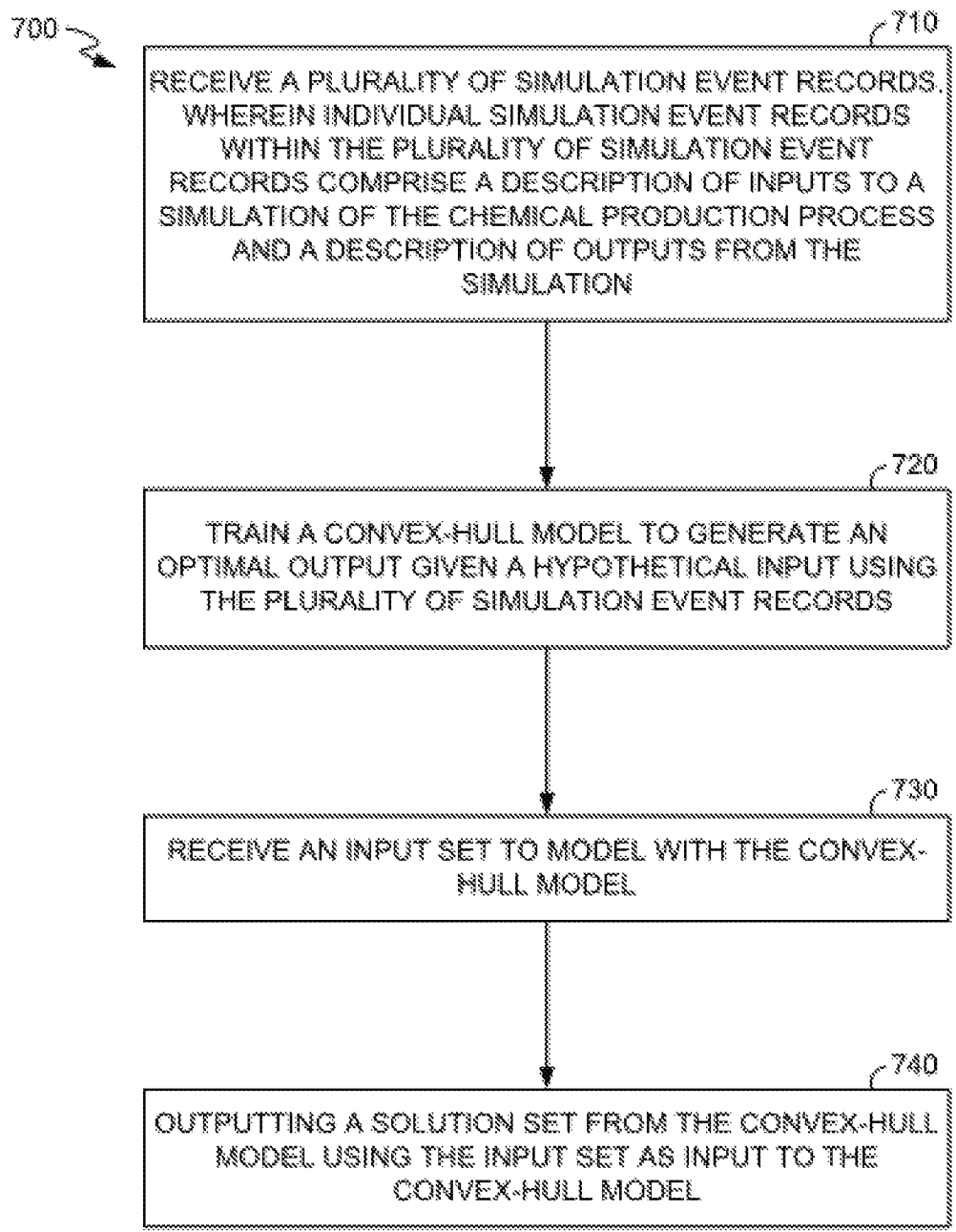

Turning now to FIG. 7, a method 700 for modeling a chemical production process is provided. Method 700 may be performed by a computing system similar to system 200 described previously.

At step 710, a plurality of simulation event records are received. The individual simulation event records within the plurality of simulation event records comprise a description of inputs to a simulation of the chemical production process and a description of outputs from the simulation. Simulation event records have been described previously with reference to the production simulator 220.

At step 720, a convex hull model is trained to generate an optimal output given a hypothetical input using the plurality of simulation event records. The training data can be used to build a convex hull, which is a representation of the solution space. If X is the set of all decision variables in the training data, then the convex hull is the minimal convex set that contains all points in X. The convex hull will include all points in the training data and additional points that are not in the training data output sets. Once calculated, the convex hull can be used to predict a solution for an input that is not in the training data. Constraints may be used to keep the input within ranges that are consistent with the space modeled by the convex hull.

As mentioned, the input to the surrogate model can be multi-dimensional. For example, the input can be defined as a combination of different crude oil characteristics. If ten different crude oils are being fed into the refinery and each crude is described by ten different characteristics, then the input space for the convex hull model has 100 dimensions. In some aspects, it may be advantageous to reduce the model complexity by characterizing types of crudes in the input. In the above example, if each oil in the input is represented by a single characterization, then this could reduce the input dimensions from 100 to 10. The crude oil inputs could be grouped by characteristics used in the market to describe the origin on the oil, such as West Texas crude (WTI), Brent Blend, or OPEC crude. Other grouping by similar physical characteristics of different crudes may be used. The characteristics of different batches (e.g., tankers) of oil from these sources can vary, but characteristics of different batches can be similar enough to find an optimized solution with the surrogate model.

Another approach to reducing the input dimensions can be to preprocess the input data to generate an estimate of composite characteristics of a crude oil blend to be modeled. For example, if 10 different crudes are mixed into a refinery for processing, then a composite density, composite sulfur content, composite cost/barrel, etc. can be calculated. The characteristics found to have the strongest correlation to a modeled output can be selected to define the input space. For example, only the six most strongly correlated characteristics may be input to the model.

In one aspect, the output space can be multi-dimensional. For example, the output space could be represented by different volumes of jet fuel, kerosene, gasoline, etc. Alternatively, the output could be represented as a percentage of different products produced per barrel of oil input (e.g., 5% jet fuel, 30% gasoline).

In another aspect, the output space can be reduced to a single dimension by using financial data as a proxy for a more complex representation of the output. For example, the output could be expressed as revenue/barrel of input or profit/barrel of input.

If an approach is used to reduce the dimensions of the input or output space, then the same approach should be used on the training data and the input set used to generate the convex hull model.

Selecting the training data can be an important part of the model building process. The training data can be selected using knowledge of the chemical production process. In one aspect, only simulation event records falling within a range from a normal operating range found in real-world operations are selected for training. Simulations may be run for various reasons, including to test operating conditions that are not likely to be found in the real world. For example, some simulations may demonstrate the benefit of not running the process in certain ranges. Simulations that demonstrate a poor performance may be described as negative simulations. They may illustrate ranges at which the process should not be operated The negative simulations may be excluded from a training set. The actual training set may be limited to event records having simulation inputs within a range from actually observed inputs in the real-world production process. The range may be set using knowledge of the chemical production process and can vary from limitation to limitation. In one aspect, the range is ⅛ of a standard deviation from the average input found in an operating scenario.

A chemical production process may have different operating scenarios. For example, a first scenario may use a first type of oil as a primary input with four other types mixed in. In this case, the percentage of each type of oil may be an input and the percentage of each may fluctuate within a range designed to produce the optimal output. In a second scenario, none of the first type of oil may be input to the process. Instead, a second primary oil type is input to the process along with the four other types. The percentage of the four other types may be very different than in the first scenario in order to achieve an optimal result. In fact, the percentage ranges for different types of oil may not overlap in between scenarios. For example, in the first scenario, a third oil type may be between 15-20% of the input. In the second scenario, the third oil type may be between 5-10% of the input. Knowledge of the process can be used to identify different scenarios and reasonable ranges of inputs in each scenario. These ranges can then be used to select the training data.

Various algorithms exist for calculating a convex hull of a solution set. Chan's algorithm can be used for two and three-dimensional cases. The Quickhull algorithm can be used in multi-dimensional cases. Use of other algorithms is possible, particularly if the output space is planar.

In one aspect, a subset of available simulation event records or production event records are set aside for testing. The simulation event records and production event records provide an accurate output for a given input. In order to test the trained model, the input from a production or simulation event record can be provided to the model. The output calculated by the model can then be compared to the output associated with the input in the event record. This process can be repeated to generate an estimated model error. Depending on the error, the model could be retrained. In one aspect, models can underperform with certain types of inputs, especially if they do not match inputs found in the training data. In this case, additional training data near the inputs that produced a large or undesirable error rate can be intentionally generated, for example, by running simulations, and used to retrain the model.

At step 730, an input set is received to model with the convex hull model. All points in the convex hull should be feasible solutions to the model, so long as the input conditions to be estimated are similar to the input conditions modeled. Constraints can be placed on the input space to limit inputs to a feasible range. Alternatively, a notification can be issued if the input parameters to the model differ from the training data by more than a notification threshold.

At step 740, a solution set is output from the convex hull model using the input set as input to the convex hull model.
Exemplary Operating Environment Referring to the drawings in general, and initially to FIG. 8 in particular, an exemplary operating environment for implementing aspects of the technology described herein is shown and designated generally as computing device 800. Computing device 800 is but one example of a suitable computing environment and is not intended to suggest any limitation as to the scope of use of the technology described herein. Neither should the computing device 800 be interpreted as having any dependency or requirement relating to any one or combination of components illustrated.

The technology described herein may be described in the general context of computer code or machine-useable instructions, including computer-executable instructions such as program components, being executed by a computer or other machine, such as a personal data assistant or other handheld device. Generally, program components, including routines, programs, objects, components, data structures, and the like, refer to code that performs particular tasks or implements particular abstract data types. The technology described herein may be practiced in a variety of system configurations, including handheld devices, consumer electronics, general-purpose computers, specialty computing devices, etc. Aspects of the technology described herein may also be practiced in distributed computing environments where tasks are performed by remote-processing devices that are linked through a communications network.

Figure 8:
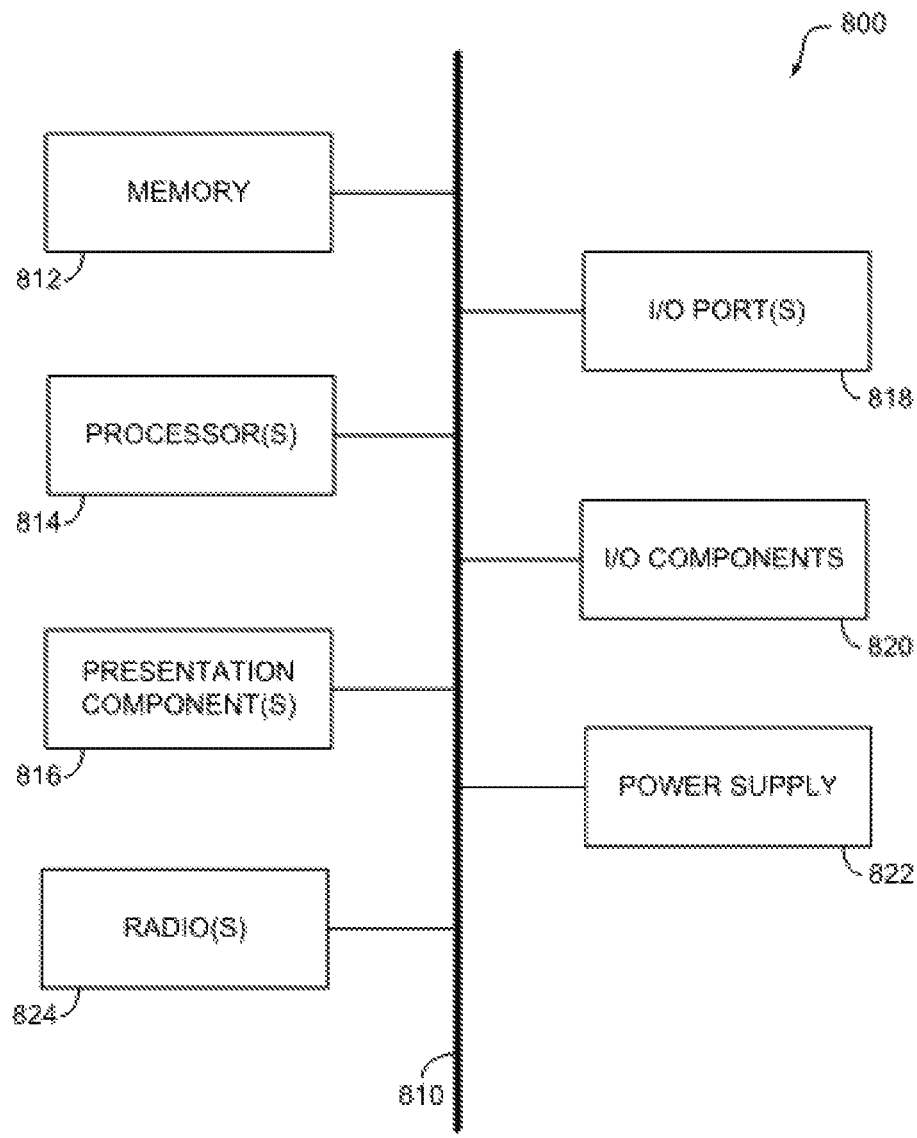
FIG. 8 is a diagram showing a computing system environment suitable for use with aspects of the technology described herein.

With continued reference to FIG. 8, computing device 800 includes a bus 810 that directly or indirectly couples the following devices: memory 812, one or more processors 814, one or more presentation components 816, input/output (I/O) ports 818, I/O components 820, and an illustrative power supply 822. Bus 810 represents what may be one or more busses (such as an address bus, data bus, or a combination thereof). Although the various blocks of FIG. 8 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. The inventors hereof recognize that such is the nature of the art and reiterate that the diagram of FIG. 8 is merely illustrative of an exemplary computing device that can be used in connection with one or more aspects of the technology described herein. Distinction is not made between such categories as "workstation," "server," "laptop," "handheld device," etc., as all are contemplated within the scope of FIG. 8 and refer to "computer" or "computing device."

Computing device 800 typically includes a variety of computer-readable media. Computer-readable media can be any available media that can be accessed by computing device 800 and includes both volatile and nonvolatile, removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules, or other data.

Computer storage media includes RAM, ROM, EEPROM, flash memory or other memory technology, CD-ROM, digital versatile disks (DVD) or other optical disk storage, magnetic cassettes, magnetic tape, magnetic disk storage or other magnetic storage devices. Computer storage media does not comprise a propagated data signal.

Communication media typically embodies computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RE, infrared, and other wireless media. Combinations of any of the above should also be included within the scope of computer-readable media.

Memory 812 includes computer storage media in the form of volatile and/or nonvolatile memory. The memory 812 may be removable, non-removable, or a combination thereof. Exemplary memory includes solid-state memory, hard drives, optical-disc drives, etc. Computing device 800 includes one or more processors 814 that read data from various entities such as bus 810, memory 812, or I/O components 820. Presentation component(s) 816 present data indications to a user or other device. Exemplary presentation components 816 include a display device, speaker, printing component, vibrating component, etc. I/O ports 818 allow computing device 800 to be logically coupled to other devices, including I/O components 820, some of which may be built in.

Illustrative I/O components include a microphone, joystick, game pad, satellite dish, scanner, printer, display device, wireless device, a controller (such as a stylus, a keyboard, and a mouse), a natural user interface (NUI), and the like. In aspects, a pen digitizer (not shown) and accompanying input instrument (also not shown but which may include, by way of example only, a pen or a stylus) are provided in order to digitally capture freehand user input. The connection between the pen digitizer and processor(s) 814 may be direct or via a coupling utilizing a serial port, parallel port, and/or other interface and/or system bus known in the art. Furthermore, the digitizer input component may be a component separated from an output component such as a display device, or in some aspects, the useable input area of a digitizer may coexist with the display area of a display device, be integrated with the display device, or may exist as a separate device overlaying or otherwise appended to a display device. Any and all such variations, and any combination thereof, are contemplated to be within the scope of aspects of the technology described herein.

A computing device may include a radio 824. The radio 824 transmits and receives radio communications. The computing device may be a wireless terminal adapted to receive communications and media over various wireless networks. Computing device 800 may communicate via wireless protocols, such as code division multiple access ("CDMA"), global system for mobiles ("GSM"), or time division multiple access ("TDMA"), as well as others, to communicate with other devices. The radio communications may be a short-range connection, a long-range connection, or a combination of both a short-range and a long-range wireless telecommunications connection. When we refer to "short" and "long" types of connections, we do not mean to refer to the spatial relation between two devices. Instead, we are generally referring to short range and long range as different categories, or types, of connections (i.e., a primary connection and a secondary connection). A short-range connection may include a Wi-Fi® connection to a device (e.g., mobile hotspot) that provides access to a wireless communications network, such as a WLAN connection using the 802.11 protocol. A Bluetooth connection to another computing device is a second example of a short-range connection. A long-range connection may include a connection using one or more of CDMA, GPRS, GSM, TDMA, and 802.16 protocols.

EMBODIMENTS

Embodiment 1. A method for modeling a chemical production process comprising: receiving a plurality of simulation event records, wherein individual simulation event records within the plurality of simulation event records comprise a description of inputs to a simulation of the chemical production process and a description of outputs from the simulation, wherein the simulation models mass flows that are constrained by physical characteristics of equipment in a real-world chemical production facility in which the chemical production process occurs; training a computer-learned surrogate model to generate an optimal statistical output given a hypothetical input using the plurality of simulation event records, wherein the computer-learned surrogate model comprises a constraint that constrains input variable values to a range bounded by a lowest and a highest input value found in the plurality of simulation event records; receiving an input set to model with the computer-learned surrogate model; confirming that each input value in the input set conforms with the constraint; and outputting a solution set from the computer-learned surrogate model using the input set as input.

Embodiment 2. The method of embodiment 1, wherein the description of inputs includes a plurality of oil assays for a mixture of oils used as input, wherein each oil assay comprises values for at least five attributes of the chemical production process.

Embodiment 3. The method as in any one of embodiments 1 and 2, wherein the compute earned surrogate model further comprises an output constraint that constrains output variable values to a range bounded by a lowest and a highest output value found in the plurality of simulation event records.

Embodiment 4. The method as in any one of embodiments 1, 2, and 3, wherein the description of inputs includes a purchase cost of a chemical input at a time of a simulation that produced a corresponding event record.

Embodiment 5. The method as in any one of embodiments 1, 2, 3, and 4, wherein the computer-learned surrogate model is neural network.

Embodiment 6. The method as in any one of embodiments 1, 2, 3, 4 and 5, wherein the computer-learned surrogate model is a convex hull model.

Embodiment 7. The method as in any one of embodiments 1, 2, 3, 4, 5 and 6, wherein the computer-learned surrogate model is a linear regression.

Embodiment 8. A method for modeling a chemical production process, comprising: receiving a plurality of simulation event records, wherein individual simulation event records within the plurality of simulation event records comprise a description of inputs to a simulation of the chemical production process and a description of outputs from the simulation; training a linear regression model to generate an optimal output given a hypothetical input using the plurality of simulation event records; adding a constraint to the linear regression model which constrains input variable values to a lowest and a highest value observed in the plurality of simulation event records; adding a hyperplane constraint to the linear regression model by running a simulation that finds an optimal solution that is infeasible and excluding solution space around the optimal solution from the linear regression model; and storing the linear regression model along with the constraint and the hyperplane constraint.

Embodiment 9. The method of embodiment 8, further comprising: inputting an input vector to the linear regression model, the input vector having more than ten dimensions; and receiving an output from the linear regression model that estimates an optimal performance of the chemical production process under input conditions represented by the input vector.

Embodiment 10. The method as in any one of embodiments 8 and 9, further comprising: providing, to the model, an input portion from a simulation event record not used to train the model; receiving an output from the model in response to the input; and calculating an error for the linear regression model by comparing the output with a simulated output in the simulation event record.

Embodiment 11. The method as in any one of embodiments 8, 9, and 10, wherein the description of inputs includes a plurality of oil assays for a mixture of oils used as input, wherein each oil assay comprises values for at least five attributes of an associated oil input to the chemical production process.

Embodiment 12. The method as in any one of embodiments 8, 9, 10, and 11, wherein the description of inputs includes a purchase cost of a chemical input at a time of a simulation that produced a corresponding event record.

Embodiment 13. The method as in any one of embodiments 8, 9, 10, 11, and 12, wherein the simulation models mass flows that are constrained by physical characteristics of equipment in a real-world chemical production facility in which the chemical production process occurs.

Embodiment 14. The method as in any one of embodiments 8, 9, 10, 11, 12, and 13, wherein the simulation event records are limited to simulations that fall within a designated range from actual conditions observed in a real-world operation of the chemical production process.

Embodiment 15. A method for modeling a chemical production process, comprising: receiving a plurality of simulation event records, wherein individual simulation event records within the plurality of simulation event records comprise a description of inputs to a simulation of the chemical production process and a description of outputs from the simulation; training a convex hull model to generate an optimal output given a hypothetical input using the plurality of simulation event records; receiving an input set to model with the convex hull model; and outputting a solution set from the convex hull model using the input set as input to the convex hull model.

Embodiment 16. The method of embodiment 15, wherein the simulation models mass flows that are constrained by physical characteristics of equipment in a real-world chemical production facility in which the chemical production process occurs.

Embodiment 17. The method as in any one of embodiments 15 and 16, wherein the inputs are constrained to a range governed by values found in a set of real-world input data, that describes actual operating conditions in the chemical production process.

Embodiment 18. The method as in any one of embodiments 15, 16, and 17, wherein the outputs comprise a profit realized by the chemical production process.

Embodiment 19. The method as in any one of embodiments 15, 16, 17 and 18, wherein the description of inputs includes a plurality of oil assays for a mixture of oils used as input, wherein each oil assay comprises values for at least five attributes of an associated oil input to the chemical production process.

Embodiment 20. The method as in any one of embodiments 15, 16, 17, 18 and 19, wherein the description of inputs includes a purchase cost of a chemical input at a time of a simulation that produced a corresponding event record.

The present invention has been described above with reference to numerous embodiments and specific examples. Many variations will suggest themselves to those skilled in this art in light of the above detailed description. All such obvious variations are within the full intended scope of the appended claims.

The invention claimed is:

1. A method for modeling a chemical production process comprising:

receiving a plurality of simulation event records, wherein individual simulation event records within the plurality of simulation event records comprise a description of inputs to a simulation of the chemical production process and a description of outputs from the simulation, wherein the simulation models mass flows that are constrained by physical characteristics of equipment in a real-world chemical production facility in which the chemical production process occurs;

training a computer-learned surrogate model to generate an optimal statistical output given a hypothetical input using the plurality of simulation event records, wherein the computer-learned surrogate model comprises a constraint that constrains input variable values to a range bounded by a lowest and a highest input value found in the plurality of simulation event records, wherein the optimal statistical output is generated at least according to general equation: $x_{opt}=\arg\max_x f(x,c)$, s.t.$g(x,c)\leq 0$;

receiving an input set to model with the computer-learned surrogate model;

confirming that each input value in the input set conforms with the constraint;

outputting a solution set from the computer-learned surrogate model using the input set as input; and producing a real product based on the computer-learned surrogate model using a chemical production process, the raw material comprising a lubricant or a polymer and the chemical production process comprising one or more of extracting a hydrocarbon feed, separating a hydrocarbon feed, or refining a hydrocarbon feed.

2. The method of claim 1, wherein the description of inputs includes a plurality of oil assays for a mixture of oils used as input, wherein each oil assay comprises values for at least five attributes of the chemical production process.

3. The method of claim 1, wherein the computer-learned surrogate model further comprises an output constraint that constrains output variable values to a range bounded by a lowest and a highest output value found in the plurality of simulation event records.

4. The method of claim 1, wherein the description of inputs includes a purchase cost of a chemical input at a time of a simulation that produced a corresponding event record.

5. The method of claim 1, wherein the computer-learned surrogate model is neural network.

6. The method of claim 1, wherein the computer-learned surrogate model is a convex hull model.

7. The method of claim 1, wherein the computer-learned surrogate model is a linear regression.

8. A method for modeling a chemical production process, comprising:

receiving a plurality of simulation event records, wherein individual simulation event records within the plurality of simulation event records comprise a description of inputs to a simulation of the chemical production process and a description of outputs from the simulation;

training a linear regression model to generate an optimal statistical output given a hypothetical input using the plurality of simulation event records, wherein the optimal statistical output is generated at least according to general equation: $x_{opt}=\arg\max_x f(x,c)$, s.t.$g(x,c)\leq 0$;

adding a constraint to the linear regression model which constrains input variable values to a range bounded by a lowest and a highest input value observed in the plurality of simulation event records;

adding a hyperplane constraint to the linear regression model by running a simulation that finds an optimal solution that is infeasible and excluding solution space around the optimal solution from the linear regression model;

storing the linear regression model along with the constraint and the hyperplane constraint;

inputting an input vector to the linear regression model, the input vector having more than ten dimensions;

receiving an output from the linear regression model that estimates an optimal performance of the chemical production process under input conditions represented by the input vector; and producing a real product based on the computer-learned surrogate model using a chemical production process, the raw material comprising a lubricant or a polymer and the chemical production process comprising one or more of extracting a hydrocarbon feed, separating a hydrocarbon feed, or refining a hydrocarbon feed.

9. The method of claim 8, further comprising:

providing, to the model, an input portion from a simulation event record not used to train the model:

receiving an output from the model in response to the input; and calculating an error for the linear regression model by comparing the output with a simulated output in the simulation event record.

10. The method of claim 8, wherein the description of inputs includes a plurality of oil assays for a mixture of oils used as input, wherein each oil assay comprises values for at least five attributes of an associated oil input to the chemical production process.

11. The method of claim 8, wherein the description of inputs includes a purchase cost of a chemical input at a time of a simulation that produced a corresponding event record.

12. The method of claim 8, wherein the simulation models mass flows that are constrained by physical characteristics of equipment in a real-world chemical production facility in which the chemical production process occurs.

13. The method of claim 8, wherein the simulation event records are limited to simulations that fall within a designated range from actual conditions observed in a real-world operation of the chemical production process.

14. The method of claim 1, wherein the inputs are constrained to a range governed by values found in a set of real-world input data that describes actual operating conditions in the chemical production process.

15. The method of claim 1, wherein the outputs comprise a profit realized by the chemical production process.

16. The method of claim 1, wherein the range is +/−⅛ of a standard deviation from the average of the input variable in an operating scenario.

17. The method of claim 8, wherein the range is +/−⅛ of a standard deviation from the average of the input variable in an operating scenario.

* * * * *